US007936528B2

(12) United States Patent
Tennant (10) Patent No.: US 7,936,528 B2
(45) Date of Patent: May 3, 2011

(54) GRADED ORDER-SORTING FILTER FOR HYPERSPECTRAL IMAGERS AND METHODS OF MAKING THE SAME

(75) Inventor: William E Tennant, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 309 days.

(21) Appl. No.: 12/347,435

(22) Filed: Dec. 31, 2008

(65) Prior Publication Data

US 2010/0164029 A1    Jul. 1, 2010

(51) Int. Cl.
*G02B 5/22* (2006.01)
*H01L 31/0232* (2006.01)
*H01L 21/00* (2006.01)

(52) U.S. Cl. .......... 359/885; 359/888; 427/164; 438/70; 438/71; 257/432; 257/442

(58) Field of Classification Search .......... 359/885, 359/888; 427/164; 438/70, 71; 257/442
See application file for complete search history.

(56) References Cited

U.S. PATENT DOCUMENTS

| 4,957,371 | A  | 9/1990 | Pellicori |
| 6,717,965 | B2 | 4/2004 | Hopkins |
| 7,230,959 | B2 | 6/2007 | Johnson |
| 2002/0131047 | A1 | 9/2002 | Zarrabian |
| 2004/0156596 | A1 | 8/2004 | Parsons |

*Primary Examiner* — Evan Pert
(74) *Attorney, Agent, or Firm* — Koppel, Patrick, Heybl & Dawson (57) ABSTRACT

A graded order-sorting filter for hyperspectral imagers and methods of making the same are provided. The graded order-sorting filter includes a substrate wafer having a first side and a second side and is formed of a material that is substantially transparent to light photons. The graded order-sorting filter also includes an absorption filter deposited outwardly from the first side of the substrate wafer. The absorption filter is tapered along a taper direction and formed of a graded composition semiconductor material with a bandgap graded to decrease outwardly from the substrate wafer and/or graded along the taper direction. The graded composition semiconductor material is substantially transparent to the light photons for photon energies substantially less than the bandgap. The above filter can also be aligned to a two-dimensional array of pixels to form a hyperspectral imager.

30 Claims, 5 Drawing Sheets

GRADED ORDER-SORTING FILTER FOR HYPERSPECTRAL IMAGERS AND METHODS OF MAKING THE SAME

BACKGROUND

This disclosure relates to imaging devices and more particularly to graded order-sorting filters for hyperspectral imagers and methods of fabricating the same.

SUMMARY

A graded order-sorting filter for hyperspectral imagers is disclosed. The filter includes a substrate wafer having a first side and a second side, and is formed of a material that is substantially transparent to light photons. The filter also includes an absorption filter deposited outwardly from the first side of the substrate wafer. The absorption filter is tapered along a taper direction and formed of a graded composition semiconductor material with a graded bandgap. The graded bandgap may be graded outwardly from the substrate wafer and/or graded along the taper direction. The graded composition semiconductor material is substantially transparent to the light photons for photon energies substantially less than the bandgap.

In one embodiment, a hyperspectral imager is disclosed. The hyperspectral imager includes the graded order-sorting filter disposed outwardly and substantially parallel to a two-dimensional array of pixels that is arranged in a plurality of rows and a plurality of columns. An anti-reflective coating may be formed on a top surface of the absorption filter, on the second side of the substrate wafer, and/or on a top surface of the two-dimensional array of pixels.

In one embodiment, a method for fabricating a filter for hyperspectral imagers is provided. The method includes forming a tapered absorption filter on a first side of a substantially transparent substrate wafer. The tapered absorption filter may be formed by depositing a semiconductor material with a graded composition of at least two constituents on the first side of the substantially transparent substrate wafer, and selectively etching the semiconductor material to taper off along a taper direction. The tapered absorption filter may also be formed by selectively depositing a semiconductor material in a tapered manner with a graded composition of at least two constituents on the first side of the substantially transparent substrate wafer. In one embodiment, the tapered absorption filter has a graded bandgap with a decreasing absorption coefficient of short wavelength light photons along the taper direction.

In one embodiment, a method for fabricating a hyperspectral imager is provided. The method includes forming the tapered absorption filter on a first side of a substantially transparent substrate wafer and aligning the two-dimensional array of pixels substantially parallel to a second side of the substantially transparent substrate wafer with a gap in between.

BRIEF DESCRIPTION OF THE DRAWINGS

The above-mentioned features and objects of the present disclosure will become more apparent with reference to the following description taken in conjunction with the accompanying drawings wherein like reference numerals denote like elements and in which.

DETAILED DESCRIPTION

In the description that follows, the present invention will be described in reference to an embodiment that provides a graded order-sorting filter for hyperspectral imagers and methods of fabricating the same. The present invention, however, is not limited to any particular application nor is it limited by the examples described below. Various modifications to the disclosed embodiments will be apparent to those skilled in the art and the general principles defined herein may be applied to other embodiments and applications without departing from the spirit and scope of the invention. Therefore, the description of the embodiments that follow are for purposes of illustration and not limitation.

Currently, filters are placed in front of focal plane arrays (FPAs) to block higher order light wavelengths. FPAs may be used to collect and process data from the entire electromagnetic spectrum. As such, a hyperspectral FPA processes not only visible light but also ultraviolet and infrared light. Hyperspectral imagers may be used in applications such as long range terrestrial surveillance, earth imaging, data, signal and image processing, medical imaging, space missions, and ground-based as well as space-based astronomy. However, current hyperspectral imagers use complex filters in front of the FPA to block higher order reflections (almost 3 octaves in frequency, with up to six orders of the shortest wavelengths) from the diffraction grating used to provide spectral dispersion.

These filters have complex designs, are thick and challenging to fabricate and install. They partially obstruct the FPA where they abut. The edges of these abutting filters obstruct spectral bands, thereby effectively scattering incident light. This scattering renders several rows of pixels in the hyperspectral imager useless wherever the scattering occurs. Thus, filters currently used for hyperspectral imagers require precise alignment in front of the FPA to assure that the shadows of the filter edges fall in spectrally unwanted regions, thereby preventing scattering.

Figure 1:
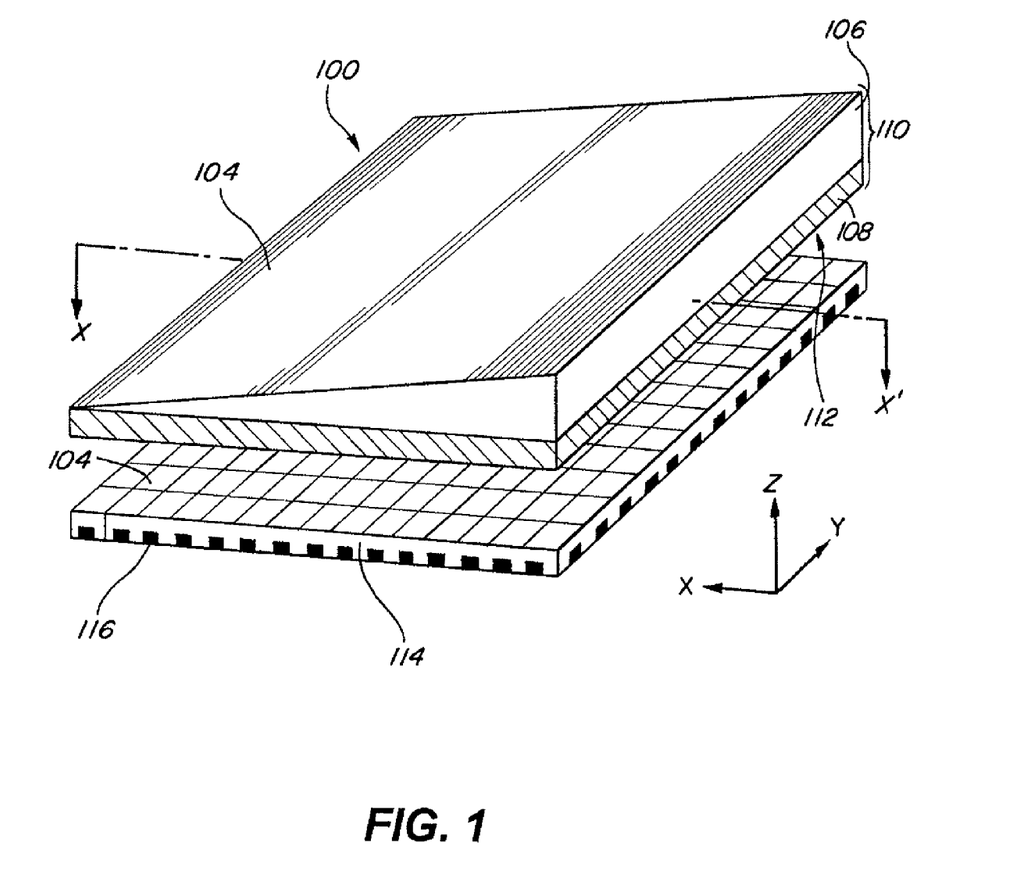
FIG. 1 is a three-dimensional view of a hyperspectral imager with a graded order-sorting filter, according to an embodiment of the present disclosure.
Figure 2:
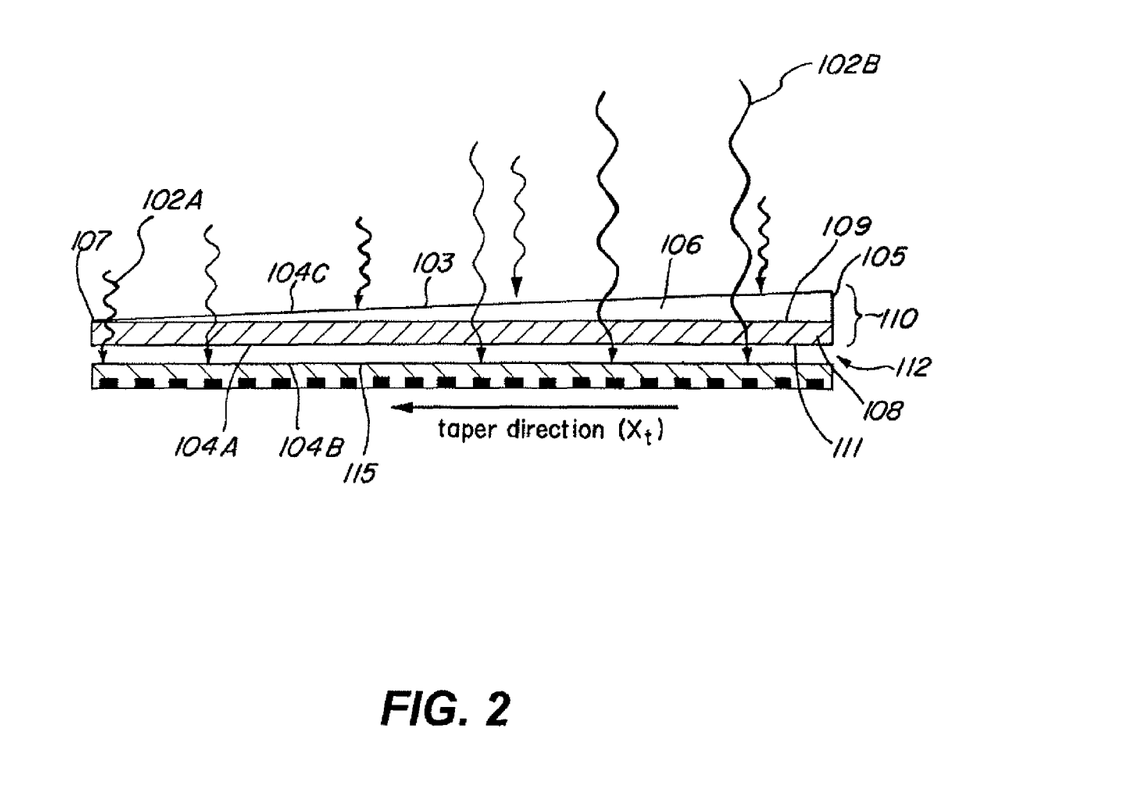
FIG. 2 is a side view of the hyperspectral imager of FIG. 1 along the lines x-x'.

FIG. 1 is a three-dimensional view of a hyperspectral imager 100 with a graded order-sorting filter, according to an embodiment of the present disclosure. FIG. 2 is a side view of the hyperspectral imager 100 of FIG. 1 along the lines x-x'. Hyperspectral imager 100 may include a two-dimensional array of pixels 116 and a graded order-sorting filter 110. The two-dimensional array of pixels 116 may be arranged in a plurality of rows and a plurality of columns.

The graded order-sorting filter 110 may be disposed outwardly from and positioned substantially parallel to the two-dimensional array of pixels 116 with a gap 112 in between. The filter 110 may include a substrate wafer 108 disposed outwardly from the two-dimensional array of pixels 116 and an absorption filter 106 deposited on the substrate wafer 108. The substrate wafer 108 has a first side 109 and a second side 111. The substrate wafer 108 may be formed of a material that is substantially transparent to light photons.

The absorption filter 106 may be deposited outwardly from the first side 109 of the substrate wafer 108. The absorption filter 106 may be tapered along a taper direction $x_t$, as shown in FIG. 2. The absorption filter 106 may have its widest thickness along a first edge 105 and a narrowest thickness along a second edge 107. For example, the widest thickness may be about 20 µm or more and the narrowest thickness may be about 0 µm. In one embodiment, the absorption filter 106 may be formed of a graded composition semiconductor material with a bandgap graded to decrease outwardly from the substrate wafer 108. Preferably, the graded composition semiconductor material is substantially transparent to the light photons for photon energies substantially less than the bandgap. In another embodiment, the absorption filter 106 may be formed of a graded composition semiconductor material with a bandgap graded along the taper direction $x_t$.

The gap 112, as shown in FIG. 1, may be an optically insignificant gap with a fluid having a pressure at or below atmospheric pressure. For example, the gap 112 may be a vacuum gap.

An anti-reflective coating 104 may be formed on a top surface 103 of the absorption filter 106, on the second side 111 of the substrate wafer 108, and/or on a top surface 115 of a detector substrate 114. The anti-reflective coating 104 may be used to reduce the reflection of light photons 102 on the surface(s) applied thereon.

The light photons 102 may have different wavelengths 102, for example, ranging from 0.8 µm to 2.5 µm, but can readily comprise other wavelength ranges by changing the types of semiconductor materials used. As can be appreciated, the light photons 102 may have at least one short wavelength light photon 102A and at least one long wavelength light photon 102B. Rather than being reflected by a filter, the light photons 102 are absorbed by the absorption filter 106. Since the absorption filter 106 has a graded composition with a graded bandgap, light photons 102 of different wavelengths are absorbed differently by the absorption filter 106. In one embodiment, the absorption filter 106 may have a decreasing absorption coefficient of the at least one short wavelength light photon 102 along the taper direction $x_t$.

As can be appreciated, the absorption filter 106 may be formed of a graded composition semiconductor material with two or more materials (elements and/or compounds) having different energy band gaps. For instance, the materials may include Mercury Telluride (HgTe), Cadmium Telluride (CdTe), Zinc Telluride (ZnTe), Mercury Cadmium Telluride ($Hg_{1-x}Cd_xTe$), and/or Cadmium Zinc Telluride (CdZnTe). The type and composition of materials used for the graded composition semiconductor material depends on design specifications for absorbing light photons 102 within a predetermined wavelength range. In one embodiment, the absorption filter 106 may be formed of a graded composition semiconductor material such that the plurality of columns of pixels 116 absorb light photons 102 of different wavelength from an image scene and the plurality of rows of pixels 116 absorb light photons 102 of spatial variation from the image scene.

Figure 3:
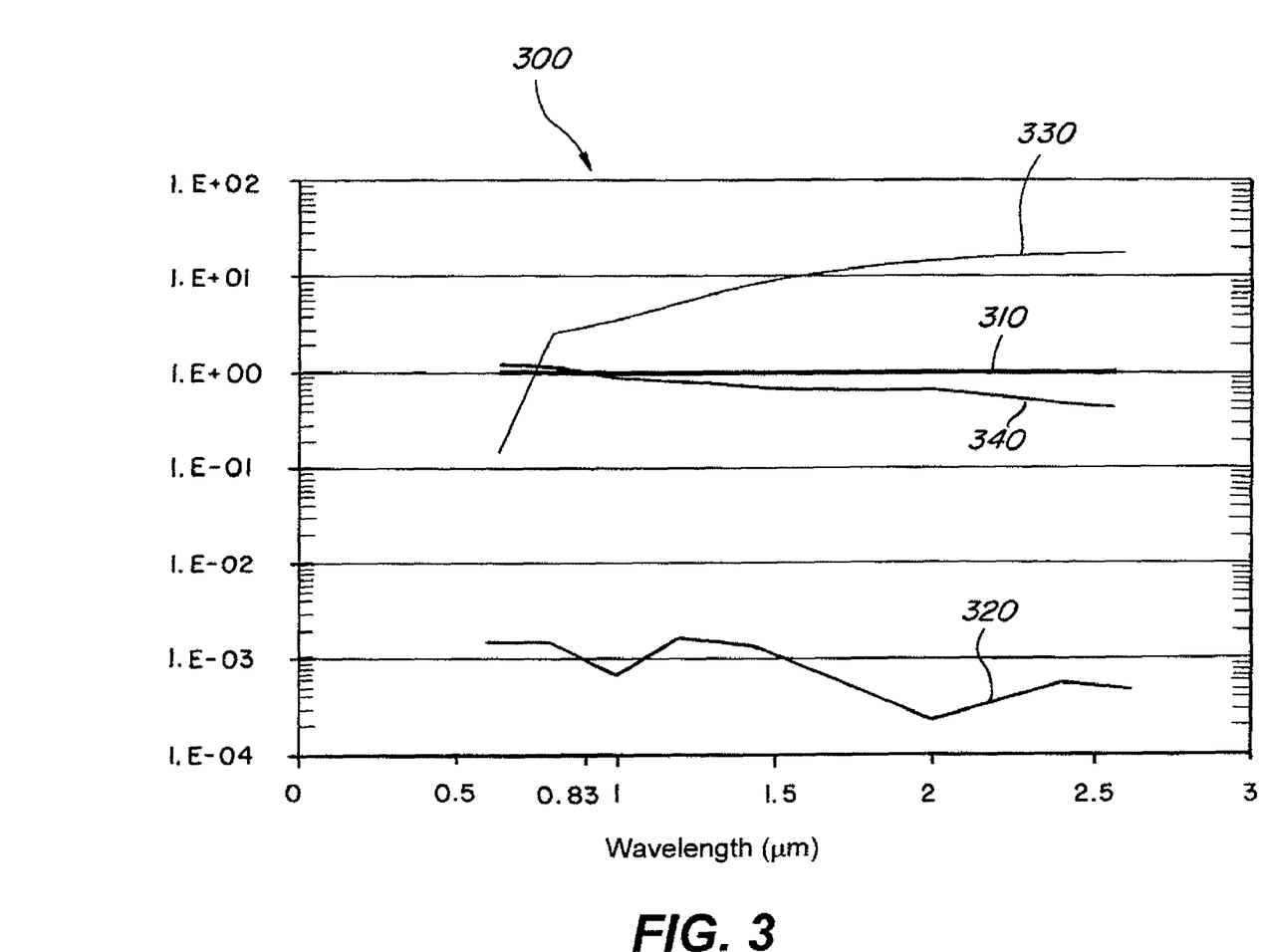
FIG. 3 is an exemplary graph illustrating first and second order wavelength absorption relative to thickness of absorption filter and composition of Cadmium (Cd), according to an embodiment of the present disclosure.

FIG. 3 is an exemplary graph 300 illustrating first and second order wavelength absorption relative to thickness of absorption filter 106 and composition of Cadmium (Cd), according to an embodiment of the present disclosure. Graph 300 illustrate a curve 310 for a first order diffraction from a primary transmission and a curve 320 for a second order diffraction from a secondary transmission. The first order diffraction of light photons 102 for curve 310 is normalized to illustrate the attenuation of light photons 102 of the second order in curve 320. As shown in FIG. 3, the absorption filter 106 may be configured to allow light photons 102 of the first order to pass through with substantially no attenuation, while attenuating light photons 102 of the second order by a factor of 1000. As such, the absorption filter 106 may be used to absorb light photons 102 of the second order or higher and allow light photons 102 of the first order to pass through.

Graph 300 also illustrates a curve 330 for the thickness of absorption filter 106 and a curve 340 for the Cadmium (Cd) fraction in the absorption filter 106. Curve 330 illustrates that as the thickness of the absorption filter 106 increases, the wavelength of light photons 102 absorbed increases. Curve 340 illustrates that the fraction of Cd decreases with increasing thickness of the absorption filter 106. In one embodiment, the absorption filter 106 may have a graded composition to absorb light photons 102 with wavelength ranging from less than 0.8 µm (including half wavelength 0.4 µm) to about 2.5 µm. The absorption filter 106 may have Mercury Cadmium Telluride compound ($Hg_{1-x}Cd_xe$), where $0 \leq x \leq 1$, to absorb light photons 102 greater than about 0.83 µm. At x=1, CdTe compound absorbs light photons 102 of about 0.83 µm wavelength. When $0 \leq x < 1$, the composition of CdTe decreases with increasing Hg, thereby narrowing the bandgap of the absorption filter 106. To absorb light photons 102 with wavelength less than about 0.83 µm, Zinc (Zn) is added to CdTe to effectively raise the bandgap above that of CdTe. Hence, according to one embodiment, the composition of the absorption filter 106 changes from $Hg_{1-x}Cd_xTe$ to CdTe to CdZnTe as it tapers off, thereby having a graded bandgap to absorb light photons 102 with wavelength ranging from less than 0.4 µm to about 2.5 µm. In one embodiment, alloys of group III-V binary compounds may be used for shorter wavelength ranges and of group IV-VI binary compounds may be used for a wide spectral range.

Figure 4:
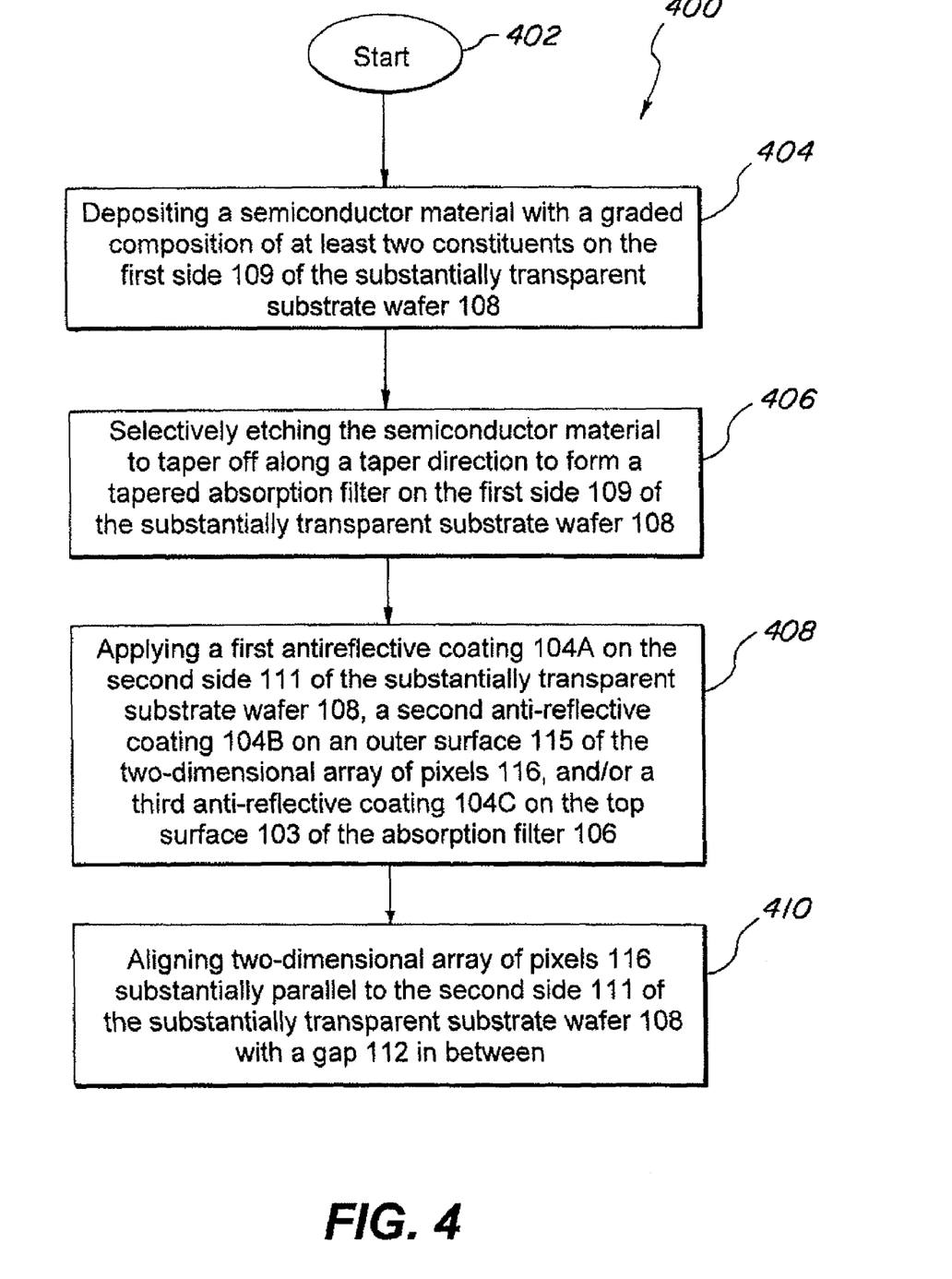
FIG. 4 is an exemplary flowchart illustrating a method of fabricating a hyperspectral imager, according to an embodiment of the present disclosure.

FIG. 4 is an exemplary flowchart 400 illustrating a method of fabricating a hyperspectral imager, according to an embodiment of the present disclosure. The method begins (402) by forming the graded order-sorting filter 110. In one embodiment, the graded order-sorting filter 110 may be formed by depositing, using for example, Molecular Beam Epitaxy (MBE) or other deposition technique, a semiconductor material with a graded composition of at least two constituents on the first side 109 of the substrate wafer 108 (404). Next, the semiconductor material may be selectively etched to taper off along a taper direction $x_t$ to form a tapered absorption filter 106 on the first side 109 of the substantially transparent substrate wafer 108 (406). The semiconductor material may be etched with, for instance, using gray-scale photolithography and dry-etching or ion-milling. Next, a first anti-reflective coating 104A may be applied on the second side 111 of the substantially transparent substrate wafer 108, a second anti-reflective coating 104B may be applied on an outer surface 115 of the two-dimensional array of pixels 116, and/or a third anti-reflective coating 104C may be applied on the top surface 103 of the absorption filter 106 (408). Then, the two-dimensional array of pixels 116 may be aligned substantially parallel to the second side 111 of the substantially transparent substrate wafer 108 with gap 112 in between (410).

Figure 5:
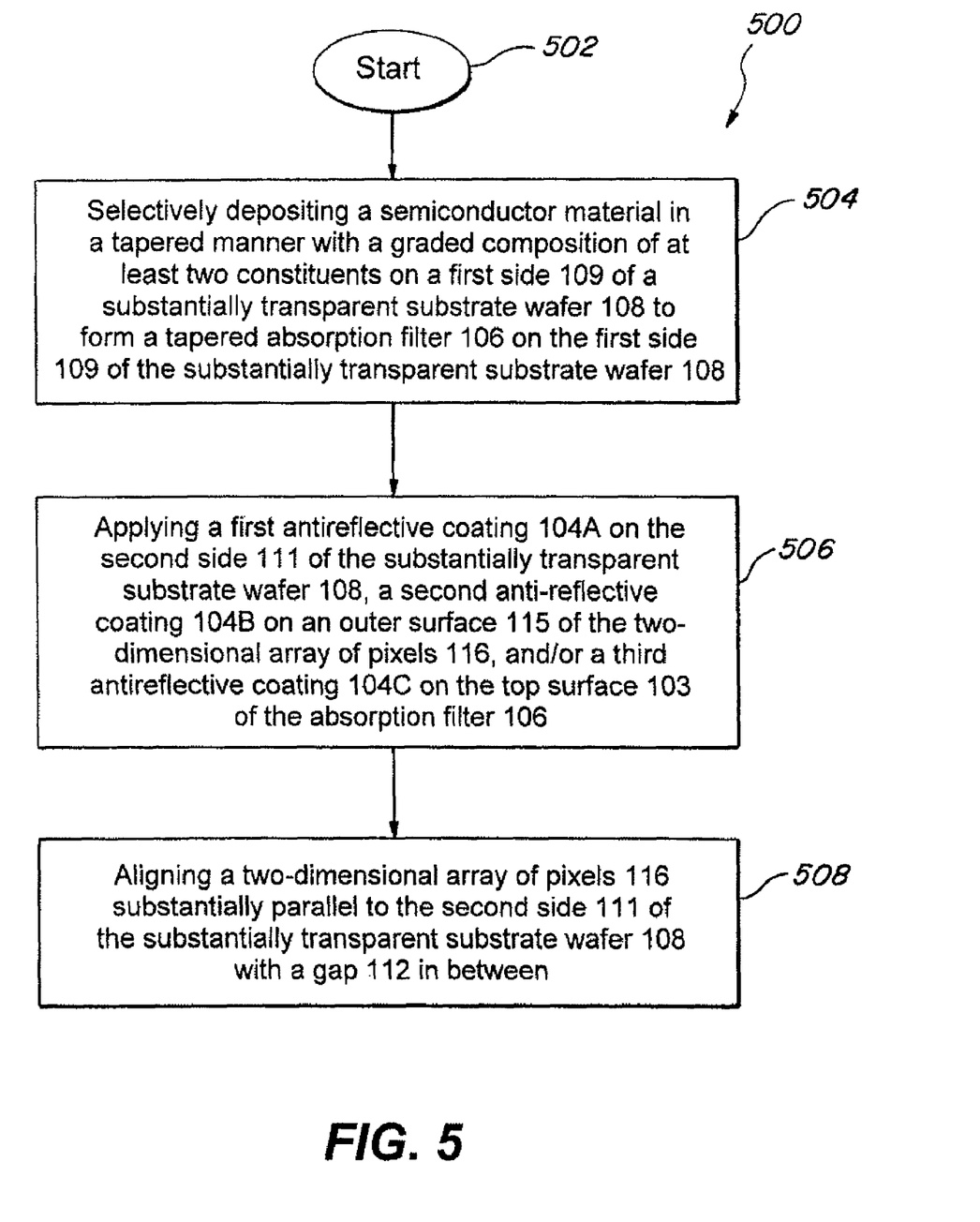
FIG. 5 is an exemplary flowchart illustrating another method of fabricating a hyperspectral imager, according to an embodiment of the present disclosure.

FIG. 5 is an exemplary flowchart 500 illustrating another method of fabricating a hyperspectral imager, according to an embodiment of the present disclosure. The method begins (502) by forming the graded order-sorting filter 110. In this embodiment, the graded order-sorting filter 110 may be formed by selectively depositing a semiconductor material in a tapered manner with a graded composition of at least two constituents on the first side 109 of the substrate wafer 108 to form a tapered absorption filter on the first side 109 of the substrate wafer 108 (504). Next, the first anti-reflective coating 104A may be applied on the second side 111 of the substantially transparent substrate wafer 108, the second anti-reflective coating 104B may be applied on an outer surface 115 of the two-dimensional array of pixels 116, and/or the third anti-reflective coating 104C may be applied on the top surface 103 of the absorption filter 106 (506). Then, the two-dimensional array of pixels 116 may be aligned substantially parallel to the second side 111 of the substantially transparent substrate wafer 108 with gap 112 in between (508).

As can be appreciated, the graded order-sorting filter 100 of the present disclosure prevents scattering and excessive diffraction. Since the graded order-sorting filter 100 absorbs rather than reflect light photons 102, the filter 100 also reduces cross-talk. Furthermore, the graded order-sorting filter 100 is simpler to manufacture or fabricate, eliminates filter edges that may obstruct spectral bands, and reduces reflection that scatters light photons 102 around the imager.

While graded order-sorting filters for hyperspectral imagers have been described in terms of what are presently considered to be the most practical and preferred embodiments, it is to be understood that the disclosure need not be limited to the disclosed embodiments. It should also be understood that a variety of changes may be made without departing from the essence of the invention. Such changes are also implicitly included in the description. They still fall within the scope of this disclosure. It should be understood that this disclosure is intended to yield a patent covering numerous aspects of the invention both independently and as an overall system and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates.

It should be understood that various modifications and similar arrangements are included within the spirit and scope of the claims, the scope of which should be accorded the broadest interpretation so as to encompass all such modifications and similar structures. The present disclosure includes any and all embodiments of the following claims.

The invention claimed is:

1. A filter for hyperspectral imagers comprising:
   a substrate wafer having a first side and a second side, the substrate wafer formed of a material that is substantially transparent to light photons; and
   an absorption filter deposited outwardly from the first side of the substrate wafer, the absorption filter being tapered along a taper direction and formed of a graded composition semiconductor material with a bandgap graded to decrease outwardly from the substrate wafer, wherein the graded composition semiconductor material is substantially transparent to the light photons for photon energies substantially less than the bandgap.

2. The filter of claim 1, wherein the absorption filter has a widest thickness along a first edge and a narrowest thickness along a second edge.

3. The filter of claim 1, wherein the light photons having at least one short wavelength light photon and at least one long wavelength light photon, the absorption filter having a decreasing absorption coefficient of the at least one short wavelength light photon along the taper direction.

4. The filter of claim 1, wherein the graded composition semiconductor material is formed of two or more materials having different energy band gaps.

5. The filter of claim 1, wherein the graded composition semiconductor material is formed from at least two materials selected from a group consisting of HgTe, CdTe, $Hg_{1-x}Cd_xTe$, and ZnTe.

6. The filter of claim 1, further comprising an anti-reflective coating formed on the second side of the substrate wafer.

7. The filter of claim 1, further comprising an anti-reflective coating formed on an outer surface of the absorption filter.

8. A hyperspectral imager comprising:
   a two-dimensional array of pixels arranged in a plurality of rows and a plurality of columns;
   a substrate wafer disposed outwardly from the two-dimensional array of pixels, the substrate having a first side and a second side, the substrate wafer formed of a material that is substantially transparent to light photons; and
   an absorption filter deposited on the first side of the substrate wafer, the absorption filter being tapered along a taper direction and formed of a graded composition semiconductor material with a graded bandgap, wherein the graded composition semiconductor material is substantially transparent to the light photons for photon energies substantially less than the graded bandgap.

9. The hyperspectral imager of claim 8, wherein the graded bandgap is graded outwardly from the substrate wafer.

10. The hyperspectral imager of claim 8, wherein the graded bandgap is graded along the taper direction.

11. The hyperspectral imager of claim 8, wherein the pixels arranged in plurality of columns absorb light photons of different wavelength from an image scene.

12. The hyperspectral imager of claim 8, wherein the pixels arranged in plurality of rows absorb light photons of spatial variation from an image scene.

13. The hyperspectral imager of claim 8, wherein the substrate is disposed substantially parallel to the two-dimensional array of pixels with a gap in between.

14. The hyperspectral imager of claim 13, wherein the gap is an optically insignificant gap with a fluid having an air pressure at or below atmospheric pressure.

15. The hyperspectral imager of claim 8, wherein the light photons having at least one short wavelength light photon and at least one long wavelength light photon, the absorption filter having a decreasing absorption coefficient of the at least one short wavelength light photon along the taper direction.

16. The hyperspectral imager of claim 8, wherein the graded composition semiconductor material is formed of two or more materials having different energy band gaps.

17. The hyperspectral imager of claim 8, wherein the graded composition semiconductor material is formed from at least two materials selected from a group consisting of HgTe, CdTe, $Hg_{1-x}Cd_xTe$, and ZnTe.

18. The hyperspectral imager of claim 8, further comprising a first anti-reflective coating formed on the second side of the substrate wafer and a second anti-reflective coated formed on an outer surface of the two-dimensional array of pixels.

19. A method for fabricating a filter for hyperspectral imagers, the method comprising:
forming a tapered absorption filter on a first side of a substantially transparent substrate wafer,
wherein the tapered absorption filter has a graded composition with a graded bandgap outwardly from the first side of the substantially transparent substrate wafer, the tapered absorption filter having a decreasing absorption coefficient of short wavelength light photons along a taper direction.

20. The method of claim 19, wherein the tapered absorption filter is formed from at least two materials selected from a group consisting of HgTe, CdTe, $Hg_{1-x}CdTe$, and ZnTe.

21. The method of claim 19, further comprising applying a first anti-reflective coating on a second side of the substrate wafer and a second anti-reflective coating on an outer surface of the tapered absorption filter.

22. The method of claim 19, wherein forming a tapered absorption filter comprises:
depositing a semiconductor material with a graded composition of at least two constituents on the first side of the substantially transparent substrate wafer; and
selectively etching the semiconductor material to taper off along the taper direction.

23. The method of claim 19, wherein forming a tapered absorption filter comprises:
selectively depositing a semiconductor material in a tapered manner with a graded composition of at least two constituents on the first side of the substantially transparent substrate wafer.

24. A method for fabricating a hyperspectral imager, the method comprising:
forming a tapered absorption filter on a first side of a substantially transparent substrate wafer, the tapered absorption filter being tapered along a taper direction and having a graded composition of at least two constituents with a graded bandgap, the tapered absorption filter is substantially transparent to light photons for photon energies substantially less than the graded bandgap; and
aligning a two-dimensional array of pixels substantially parallel to a second side of the substantially transparent substrate wafer with a gap in between.

25. The method of claim 24, wherein the at least two constituents is selected from a group consisting of HgTe, CdTe, $Hg_{1-x}Cd_xTe$, and ZnTe.

26. The method of claim 24, further comprising applying a first anti-reflective coating on a second side of the substantially transparent substrate wafer and a second anti-reflective coating on an outer surface of the two-dimensional array of pixels.

27. The method of claim 24, wherein forming a tapered absorption filter comprises:
depositing a semiconductor material with a graded composition of at least two constituents on the first side of the substantially transparent substrate wafer; and
selectively etching the semiconductor material to taper off along the taper direction.

28. The method of claim 24, wherein forming a tapered absorption filter comprises:
selectively depositing a semiconductor material in a tapered manner with a graded composition of at least two constituents on the first side of the substantially transparent substrate wafer.

29. The method of claim 24, wherein the graded bandgap is graded outwardly from the first side of the substantially transparent substrate wafer, the tapered absorption filter having a decreasing absorption coefficient of short wavelength light photons along the taper direction.

30. The method of claim 24, wherein the graded bandgap is graded along the taper direction.

* * * * *

UNITED STATES PATENT AND TRADEMARK OFFICE
CERTIFICATE OF CORRECTION

| | | |
|---|---|---|
| PATENT NO. | : 7,936,528 B2 | Page 1 of 1 |
| APPLICATION NO. | : 12/347435 | |
| DATED | : May 3, 2011 | |
| INVENTOR(S) | : William E. Tennant | |

It is certified that error appears in the above-identified patent and that said Letters Patent is hereby corrected as shown below:

In the claims:
Claim 20, line 3
Please add a subscript "x" after the second Cd in the formula Signed and Sealed this
Tenth Day of April, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,936,528 B2 | |
| APPLICATION NO. | : 12/347435 | |
| DATED | : May 3, 2011 | |
| INVENTOR(S) | : William E. Tennant | |

It is certified that error appears in the above-identified patent and that said Letters Patent is hereby corrected as shown below:

In the claims:
Column 7, line 17 (Claim 20, line 3)
Please add a subscript "x" after the second Cd in the formula This certificate supersedes the Certificate of Correction issued April 10, 2012.

Signed and Sealed this
First Day of May, 2012

David J. Kappos
*Director of the United States Patent and Trademark Office*